United States Patent
Fettke et al.

(10) Patent No.: US 12,171,066 B2
(45) Date of Patent: Dec. 17, 2024

(54) METHOD FOR REMOVING AND REPOSITIONING ELECTRONIC COMPONENTS CONNECTED TO A CIRCUIT BOARD

(71) Applicant: Pac Tech—Packaging Technologies GmbH, Nauen (DE)

(72) Inventors: Matthias Fettke, Berlin (DE); Andrej Kolbasow, Paulinenaue (DE)

(73) Assignee: Pac Tech—Packaging Technologies GmbH, Nauen (DE)

(*) Notice: Subject to any disclaimer, the term of this patent is extended or adjusted under 35 U.S.C. 154(b) by 707 days.

(21) Appl. No.: 17/507,684

(22) Filed: Oct. 21, 2021

(65) Prior Publication Data
US 2022/0132714 A1  Apr. 28, 2022

Related U.S. Application Data

(63) Continuation-in-part of application No. 17/164,159, filed on Feb. 1, 2021, now Pat. No. 12,023,756.

(30) Foreign Application Priority Data

Oct. 23, 2020 (LU) .................................. 102151

(51) Int. Cl.
*H05K 13/04* (2006.01)
*B23K 1/00* (2006.01)
(Continued)

(52) U.S. Cl.
CPC ....... *H05K 13/0486* (2013.01); *B23K 1/0016* (2013.01); *B23K 3/08* (2013.01);
(Continued)

(58) Field of Classification Search
CPC ............ B23K 1/0056; B23K 20/004; B23K 2101/32; B23K 2101/42; B23K 26/009;
(Continued)

(56) References Cited

U.S. PATENT DOCUMENTS

| 3,834,605 A | 9/1974 | Coffin | B23K 1/00 228/20 |
| 3,879,836 A | 4/1975 | Coffin | B23P 19/02 29/427 |

(Continued)

FOREIGN PATENT DOCUMENTS

| CN | 102861959 A | 7/2012 |
| CN | 106031328 A | 1/2015 |

(Continued)

OTHER PUBLICATIONS

Nakanishi, WO 2016093053 (Year: 2016).*
(Continued)

*Primary Examiner* — Vy T Nguyen
(74) *Attorney, Agent, or Firm* — Imperium Patent Works; Darden K. Wallace

(57) ABSTRACT

A device for removing or repositioning defective and erroneously placed electronic components from circuit boards includes a vacuum suction nozzle, a laser beam and a temperature sensor. The vacuum nozzle has an adaptor tip at which suction is generated. The adaptor tip is larger than the defective or erroneously positioned electronic component. The laser beam is emitted out of the suction opening towards the electronic component on the circuit board. The temperature sensor measures the temperature of the electronic component based on infrared radiation emitted from around the electronic component. A method for removing or repositioning the defective or erroneously placed electronic component from the circuit board positions the adaptor tip over the electronic component and directs the laser beam through the suction opening and onto the electronic component so as to heat and detach the electronic component, which is then removed or repositioned and remounted on the circuit board.

20 Claims, 7 Drawing Sheets

(51) Int. Cl.
  *B23K 3/08* (2006.01)
  *B23K 26/03* (2006.01)
  *B23K 101/42* (2006.01)
  *B25J 15/04* (2006.01)
  *H05K 13/08* (2006.01)

(52) U.S. Cl.
  CPC ............. *B23K 26/034* (2013.01); *B25J 15/04* (2013.01); *H05K 13/0409* (2018.08); *H05K 13/0812* (2018.08); *H05K 13/082* (2018.08); *B23K 2101/42* (2018.08)

(58) Field of Classification Search
  CPC ................ B23K 26/0884; B23K 3/087; H05K 2201/10287; H05K 2203/107; H05K 3/3421; H05K 3/3489; H05K 3/3494
  USPC ........................................................ 219/121
  See application file for complete search history.

(56) References Cited

U.S. PATENT DOCUMENTS

| | | | | |
|---|---|---|---|---|
| 5,122,635 | A | 6/1992 | Knoedler et al. | H05K 13/0465 219/121.78 |
| 5,148,969 | A | 9/1992 | Boucher et al. | B23K 1/00 228/264 |
| 5,864,944 | A | 2/1999 | Kashiwagi et al. | H05K 3/30 29/833 |
| 2002/0046461 | A1 | 4/2002 | Oe | B23P 19/00 29/743 |
| 2013/0008020 | A1* | 1/2013 | Park | B23K 1/0056 29/762 |
| 2014/0001162 | A1 | 1/2014 | Tanaka et al. | B23K 26/00 219/121.6 |
| 2014/0224773 | A1 | 8/2014 | Murata et al. | B23K 3/0623 219/85.13 |
| 2017/0352640 | A1 | 12/2017 | Park et al. | H01L 23/00 |
| 2022/0126398 | A1 | 4/2022 | Fettke et al. | B23K 26/12 |
| 2022/0132714 | A1 | 4/2022 | Fettke et al. | H05K 13/04 |

FOREIGN PATENT DOCUMENTS

| | | |
|---|---|---|
| CN | 111556705 A | 2/2020 |
| CN | 114501977 A | 1/2021 |
| CN | 114501978 A | 10/2021 |
| DE | 102018002714 | 4/2018 |
| EP | 0543270 A2 | 11/1992 |
| JP | 60-53034 | 9/1983 |
| JP | 5-235535 | 2/1992 |
| JP | 05 235535 A | 2/1992 |
| JP | H05-235535 A | 2/1992 |
| JP | H06-226478 A | 2/1993 |
| JP | H07-297539 A | 4/1994 |
| JP | 2002-501439 A | 6/1998 |
| JP | 2005-007428 A | 6/2003 |
| JP | 2006-237522 | 2/2005 |
| JP | 2006-294958 A | 4/2005 |
| JP | 2009-164310 A | 12/2007 |
| JP | 10-2019-0062089 | 12/2017 |
| JP | 2020-129658 A | 2/2020 |
| JP | 2022-69368 | 1/2021 |
| KR | 10-2019-0062089 | 12/2017 |
| KR | 10-1890934 B1 | 12/2017 |
| WO | WO2016/103800 A1 | 9/2015 |

OTHER PUBLICATIONS

Adachi, WO 2016103800 (Year: 2016).*
Office action of the Japanese Patent Office in the related Japanese patent application JP2021-000715 dated Dec. 15, 2021 citing references A-C, as well as the English translation of the Japanese Office action (8 pages).
Decision of Grant (issue notification) of the Japanese Patent Office in the related Japanese patent application JP2021-000715 dated Nov. 1, 2022 with list of references A-I considered by the examiner, including English translation (4 pages).
Office action dated Mar. 30, 2024 of the Chinese Patent Office in the related Chinese patent application CN 202110106068.8 citing references A-C, as well as the English machine translation of the Chinese Office action (15 pages).
Office action of the Korean Patent Office dated Jun. 20, 2022, in the related Korean patent application KR10-2021-0002469 citing references A-C (12 pages).
Office action of the Japanese Patent Office in the related Japanese patent application JP2021-172072 dated Oct. 26, 2022 citing references A-F, as well as the English translation of the Japanese Office action (11 pages).
Office action of the Chinese Patent Office in the related Chinese patent application CN 202110106068.8 dated Oct. 21, 2023 citing references C-E, as well as the English machine translation of the Chinese Office action (23 pages).
Decision of Grant of the Japanese Patent Office in the related Japanese patent application JP2021-172072 dated Apr. 25, 2023 citing references B-H (3 pages).
Office action of the Japanese Patent Office in the related Japanese patent application JP2021-000715 dated Aug. 2, 2022 citing references A-D, as well as the English translation of the Japanese Office action (6 pages).
Office action of the Chinese Patent Office in the related Chinese patent application CN 202110106068.8 dated Apr. 29, 2023 citing references C-I, as well as the English machine translation of the Chinese Office action (21 pages).
Office action of the Chinese Patent Office in the related Chinese patent application CN 202111235064.6 dated Apr. 29, 2023 citing references H-K, as well as the English translation of the Chinese Office action (40 pages).
Office action dated Feb. 27, 2024 in the related U.S. Appl. No. 17/164,159 citing items D-E.
Search Report of Luxembourg Patent Office dated Jul. 1, 2021 in the foreign counterpart Luxembourg Application LU 102151 citing document above (3 pages).
Notice of Allowance dated Jan. 13, 2024 from the Chinese Patent Office in the related Chinese patent application CN 202111235064.6 citing references A-B (5 pages).

* cited by examiner

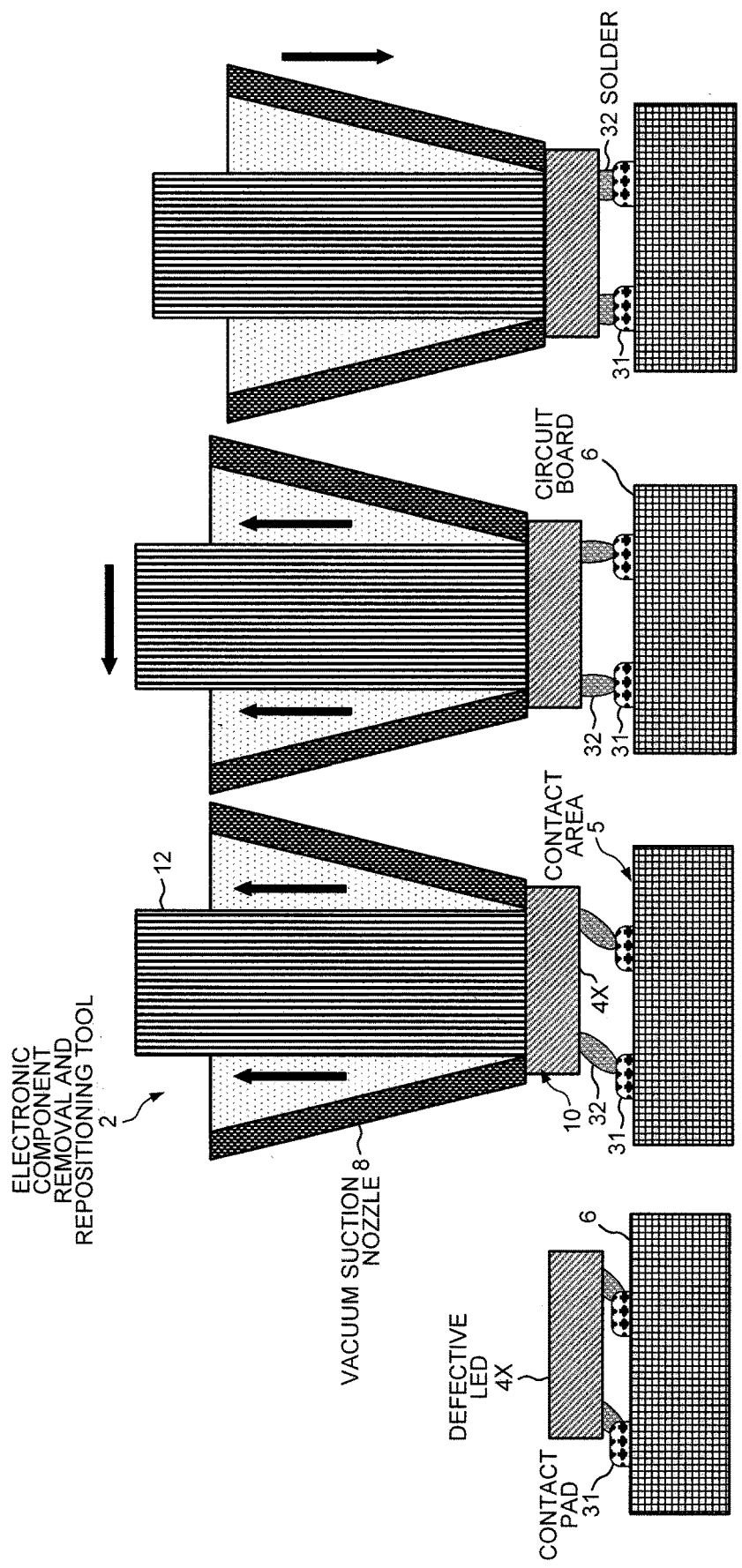

METHOD FOR REMOVING AND REPOSITIONING ELECTRONIC COMPONENTS CONNECTED TO A CIRCUIT BOARD

CROSS REFERENCE TO RELATED APPLICATION

This application is a continuation-in-part of, and claims priority under 35 U.S.C. § 120 from, nonprovisional U.S. patent application Ser. No. 17/164,159 entitled "Method for Removing Electronic Components Connected to a Circuit Board," filed on Feb. 1, 2021. Application Ser. No. 17/164,159, in turn, is a continuation-in-part of, and claims priority under 35 U.S.C. § 119 from Luxembourg Patent Application No. LU102151, filed on Oct. 23, 2020, in the Luxembourg Intellectual Property Office. The subject matter of each of the foregoing documents is incorporated herein by reference.

TECHNICAL FIELD

The invention relates to a method and an apparatus for removing or repositioning electronic components on a circuit board.

BACKGROUND

In the field of display technology with multiple mini or μLEDs arranged in a matrix on a planar circuit board, it is often necessary to replace or remove defect LEDs. In addition, it is often required to reposition or rearrange erroneously positioned or arranged LEDs on the circuit board. This is usually done by heating the defect LED and then mechanically removing or repositioning it with a gripping tool. The heating is achieved using hot nitrogen or by contact heating.

The patent document KR 101890934 B1 discloses a method for removing defect μLEDs using a laser beam for heating the defect LED and then removing it with a gripping tool, such as a vacuum pipette. A disadvantage of such a system is that the heating laser has to be positioned in the x-y plane, while the gripping tool has to be positioned in x-y-z space. This leads to a reduced processing speed.

Accordingly, it is an object of the present invention to provide a method and an apparatus for removing or repositioning electronic components on a board that permits increased processing speed and that uses simple tool-designs.

SUMMARY

A device for removing a defective electronic component from a contact area on a printed circuit board includes a vacuum suction nozzle, a laser beam emitter and an infrared temperature sensor. The vacuum suction nozzle has an exchangeable adaptor tip at which suction is generated. A first exchangeable adaptor tip is dimensioned so as to be larger than the electronic component. The laser beam emitter is oriented so as to emit a laser beam through the vacuum suction nozzle and out the adaptor tip towards the contact area on the circuit board. The temperature sensor is adapted to measure the temperature around the contact area based on infrared radiation emitted from around the contact area. A control and drive means turns off the laser beam emitter when the temperature sensor senses a sudden and significant increase in temperature or when the temperature exceeds a predetermined threshold. The control and drive means also positions the adaptor tip over the defective electronic component and controls how process gas is directed towards the contact area. In one embodiment, the defective electronic component is a micro light-emitting diode (μLED) of a matrix of LEDs that are mounted on the circuit board.

In one embodiment, a beam splitter is positioned in the path of the laser beam and reflects the infrared radiation that is emitted from the contact area towards the temperature sensor. In another embodiment, infrared radiation is guided from the contact area to the temperature sensor through a monofilament fiber guide.

A method for removing an electronic component from a circuit board includes positioning an exchangeable adaptor tip of a vacuum suction nozzle over the electronic component that is to be removed. The electronic component is mounted at a contact area onto the circuit board using solder. A laser beam is directed through the exchangeable adaptor tip and onto the electronic component. The electronic component is heated using the laser beam so as to melt the solder and detach the electronic component. The temperature around the contact area is measured based on infrared radiation emitted from around the contact area. In one embodiment, the temperature is measured based on infrared radiation emitted from around the contact area that travels through the vacuum suction nozzle and is then reflected by a beam splitter towards a temperature sensor. In another embodiment, the temperature is measured based on infrared radiation that is guided from around the contact area in a fiber guide to the temperature sensor. In yet another embodiment, the temperature is measured based on infrared radiation emitted from around the contact area that is received through optics at the temperature sensor. The laser beam is turned off when the temperature around the contact area makes a sharp increase or exceeds a threshold temperature. The electronic component is then sucked through the exchangeable adaptor tip and into the vacuum suction nozzle using vacuum suction.

In a method for repositioning an electronic component on a circuit board, the electronic component after being heated and released from the contact area is drawn towards the exchangeable adaptor tip by the vacuum suction, where the electronic component is held while the vacuum suction nozzle is moved over the circuit board so as to reposition the electronic component. The electronic component is then remounted on the circuit board.

The invention relates to a method and an apparatus for removing and/or repositioning electronic components on a circuit board with increased speed and simple design tools. In the field of display technology with multiple mini or micro LEDs arranged in a matrix on a planar circuit board, it is often necessary to replace or remove defective LEDs or to reposition erroneously arranged LEDs. This is usually done by heating the defective or erroneously placed LED and then mechanically removing or repositioning it with a gripping tool. The heating is conventionally achieved with hot nitrogen or by contact heating. The novel repositioning and removal method includes the step of selectively heating the defective or erroneously placed electronic component and its contact area on the circuit board using a laser beam. Simultaneously with the heating step, vacuum suction is applied to the electronic component that is to be removed or repositioned. When the electronic component to be removed or repositioned is released from the circuit board due to laser heating and vacuum suction, the electronic component is sucked away from the circuit board. This is achieved by applying a vacuum suction nozzle for removing or repositioning the defective or erroneously placed electronic component and a laser beam emitter guiding the heating laser beam through the vacuum suction nozzle onto the defective component. In the case of repositioning, the electronic component to be repositioned on the circuit board is held at an exchangeable adaptor tip of the vacuum suction nozzle and is then repositioned and remounted on the circuit board. Both the heating with the laser beam and the removal with the vacuum suction nozzle require positioning only in an x-y plane, i.e., no movement is necessary in the z plane. Thereby the processing speed is increased.

In another embodiment, a method for removing and repositioning an electronic component on a circuit board involves using vacuum suction to suck the electronic component towards an exchangeable adaptor tip of a vacuum suction nozzle. The exchangeable adaptor tip of the vacuum suction nozzle is positioned over the electronic component, which is mounted at a contact area on the circuit board. Image recognition is performed to determine whether the electronic component is to be removed or repositioned. In one implementation, the electronic component is a light emitting diode arranged in a matrix among other light emitting diodes on the circuit board. Electric power is supplied to the circuit board to determine whether the electronic component is to be removed or repositioned.

A laser beam is directed through the suction opening and onto the electronic component. The electronic component is heated using the laser beam. When the heat melts the solder that held the electronic component to the circuit board, the electronic component is sucked towards the exchangeable adaptor tip of the vacuum suction nozzle using vacuum suction. In the event that the electronic component is to be removed, the electronic component is removed by sucking the electronic component through a first exchangeable adaptor tip with a large aperture and into the vacuum suction nozzle using the vacuum suction. In the event the electronic component is to be repositioned, the electronic component is held by a second exchangeable adaptor tip with a grid or smaller aperture, and the vacuum suction nozzle is moved so as to reposition the electronic component on the contact area. Then the electronic component is remounted onto the circuit board.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIGS. 9A, 9B, 9C and 9D are schematic diagrams illustrating method steps for repositioning an electronic component on a circuit board according to a seventh embodiment.

DETAILED DESCRIPTION

Reference will now be made in detail to some embodiments of the invention, examples of which are illustrated in the accompanying drawings.

Figure 1:
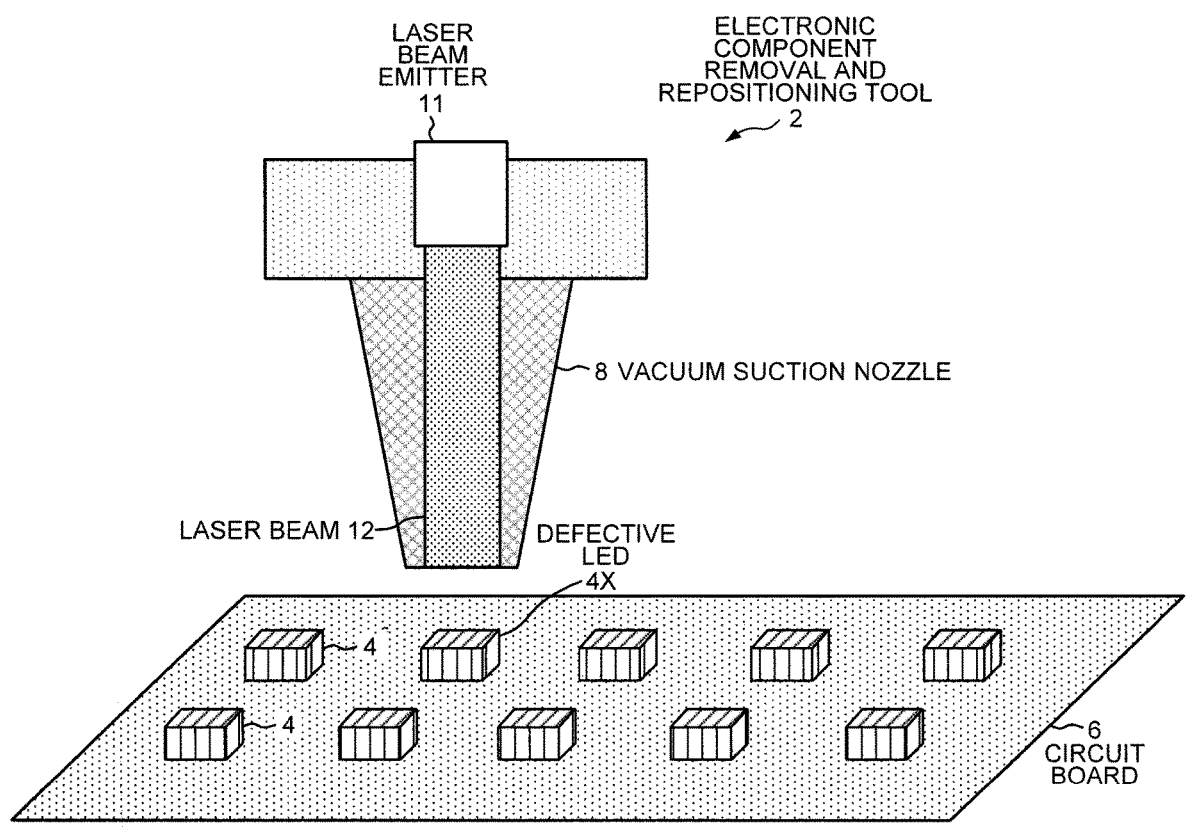
FIG. 1 is a schematic illustration showing a matrix of μLEDs, including defective or erroneously placed μLEDs, and the novel repositioning and removal tool in accordance with a first embodiment.

FIG. 1 shows a novel electronic component repositioning and removal tool 2 positioned above a defective electronic component 4X that is to be removed from a circuit board 6. The novel repositioning and removal tool 2 includes a vacuum suction nozzle 8 with a suction opening 10 and a laser beam emitter 11 used to direct a heating laser beam 12 through the center of the vacuum suction nozzle 8 and through the suction opening 10 onto the electronic component 4X that is to be removed. The heat from the laser beam 12 releases the electronic component 4X from the circuit board 6. The released electronic component 4X is sucked into the vacuum suction nozzle 8 and thereby removed from the circuit board 6.

The novel repositioning and removal method includes the step of selectively heating the defective or erroneously placed electronic component 4X and its contact area 5 on the circuit board 6 using a laser beam 12. Simultaneously with the heating step, the electronic component 4X is removed or repositioned by applying vacuum suction. When the electronic component 4X to be removed or repositioned is loosened from the circuit board 6 by the laser heating, the electronic component 4X is sucked away from the circuit board using vacuum suction. This is achieved using a vacuum suction nozzle 8 for removing the defective electronic component 4X and a laser beam emitter 11 that guides a heating laser beam 12 through the vacuum suction nozzle 8 onto the defective component 4X. In the case of repositioning, the electronic component to be repositioned is held at the tip of the vacuum suction nozzle and is then rearranged and remounted on the circuit board.

Both the heating with the laser beam 12 and the removal with the vacuum suction nozzle 8 require positioning only in the x-y plane, i.e., no movement in the z plane is necessary. The processing speed for removing defective components is thereby increased.

By directing the laser beam 12 through the vacuum suction nozzle 8, the positioning of the vacuum suction nozzle simultaneously positions the laser beam 12 over the correct location.

As an alternative, the laser beam 12 is mounted to the outside of the vacuum suction nozzle 8 so as to direct the laser beam 12 from the side to the location of the defective or erroneously positioned component under the suction opening 10 of the vacuum suction nozzle 8. Again, only one apparatus has to be positioned in the x-y plane for removal of the component.

In contrast to conventional repair processes, the aperture of the novel tool 2 is larger than the outer contour of the defective component 4X so as to allow the passage of the released component into the vacuum channel for removal. The tip of the vacuum suction nozzle 8 is exchangeable such that a first exchangeable adaptor tip has an opening large enough to allow the passage of the released component into the vacuum channel. In one embodiment, multiple exchangeable adaptor tips are successively rotated into position at the end of the vacuum suction nozzle 8 in a revolving manner. In the case of repositioning, the outer contour of a second exchangeable adaptor tip of the vacuum suction nozzle 8 is adapted such that the electronic component is held at the end of the vacuum suction nozzle 8. This is achieved by making the aperture of the second exchangeable adaptor tip of the vacuum suction nozzle 8 smaller than the diameter of the electronic component. Alternatively, the second exchangeable adaptor tip has a grid, screen or other means for holding or catching the electronic component 4X and for preventing the passage of the electronic component farther into the vacuum channel. In order to use the vacuum suction nozzle 8 intermittently for both removing and repositioning, the appropriate exchangeable adaptor tip is moved into position at the end of the vacuum suction nozzle 8 by the control and drive means of the repositioning and removal tool 2 based on input from an image recognition means.

Afterwards, the electronic component is repositioned on the circuit board by moving the vacuum suction nozzle 8, which holds the electronic component at its adaptor tip, towards the circuit board. For this reason, the vacuum suction nozzle 8 should be rotatable with respect to its longitudinal axis. Alternatively, the circuit board may be rotatable with respect to the longitudinal axis of the vacuum suction nozzle 8.

In addition, the apparatus according to the present invention can also include a means for remounting the electronic component on the circuit board, such as a means for applying solder or an adhesive. Alternatively, solder already present in the contact area of the electronic component and liquefied during the heating of the electronic component may be used for remounting, and the electronic component is held at the contact area until the liquefied solder solidifies. As a result, a erroneously arranged electronic component can be repositioned and then remounted on the circuit board.

During the heating step, the temperature of the defective or erroneously placed electronic component 4X and the temperature at its location 5 are measured in order to control the temperature with the laser beam 12 during the heating step. Excess heat and excessive temperature at the location of the defective component are thereby avoided, and damaging burning of the circuit board 6 at the location of the defective component 4X is prevented.

In one embodiment, the heating is stopped when there is a sharp increase in the measured temperature. This significant change in the temperature indicates that the defective component 4X has been detached from the circuit board 6 by vacuum suction because the heat energy of the electronic component can no longer be dissipated to the circuit board. Damage to the circuit board 6 is avoided by stopping the continued heating from the laser beam 12 as soon as a sudden increase in temperature is measured on the circuit board 6. Alternatively, the heating is stopped as soon as the solder that mounts the defective component 4X to the circuit board 6 has melted, which releases the component into the vacuum suction. The heating is stopped by turning off the laser beam 12. The laser beam can be turned off when there is a sudden and significant increase in the measured temperature or when the measured temperature exceeds a threshold.

The temperature is measured by an infrared (IR) sensor 16 with appropriate optics 18 without contacting the heated location. The IR sensor 16 can be positioned either outside of the laser interaction zone or can be within the optical laser path by using a beam splitter 25.

Alternatively, the temperature sensor 16 is provided with a light guide fiber 20 with its free end being positioned in the vicinity of the heated location. This is another way in which the temperature at the heated location can be measured.

In another embodiment, process gas 24 is passively or actively applied to the heated location in order to avoid oxidation of the solder and/or to assist the detaching process of the defective component 4X from the circuit board 6.

In another embodiment, the apparatus includes image recognition means, which includes a camera and a processing unit, that is able to detect whether an electronic component is defective or erroneously positioned on the circuit board. The image recognition means can identify an electronic component as being defective even if it is properly positioned on its contact area. An electronic component is properly positioned if it is not shifted or rotated with respect to the intended contact area or if the contacts of the electronic component, such as tabs or leads, are arranged on the intended contact pads on the circuit board. In the event that the electronic component is not properly arranged on the circuit board, i.e., the electronic component is shifted or rotated with respect to an intended contact area or the contacts of the electronic component are not placed on the intended contact pads on the circuit board, the electronic component is identified as being erroneously arranged.

In case the electronic components on the circuit board are LEDs or μLEDs, the LEDs or μLEDs to be removed or repositioned may be previously identified by the image recognition means by illuminating the matrix of LEDs or μLEDs. Afterwards, LEDs and μLEDs that do not emit light are identified as being defective or erroneously positioned.

Figure 2:
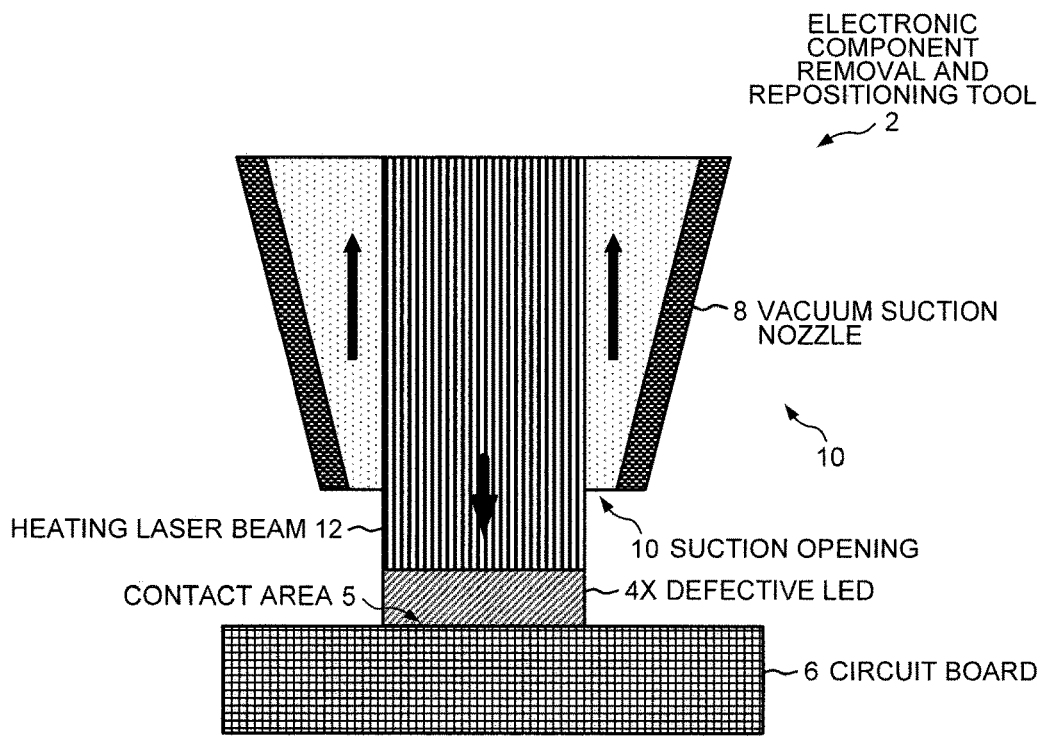
FIG. 2 is a cross-sectional view of the first embodiment with a laser beam directed through a vacuum suction nozzle.

FIGS. 1 and 2 illustrate a first embodiment of the method for removing defective or erroneously placed electronic components on a printed circuit board 6. FIG. 2 is a cross-sectional view of the first embodiment. An electronic component repositioning and removal tool 2 is positioned above a defective or erroneously positioned micro light-emitting diode (μLED) 4X that is to be removed. The defective μLED 4X and the plurality of other μLEDs 4 are positioned on contact areas 5 on a circuit board 6 in a matrix arrangement as shown in FIG. 1. The LEDs 4 and 4X are mounted to the circuit board 6 for example using solder. In one embodiment, the LEDs 4 are mounted onto contact pads on the printed circuit board 6. In the event that the μLED 4X is erroneously placed, the μLED 4x is not positioned properly on the intended contact area 5 on the circuit board 6, which results in the failure of the μLED 4x to illuminate when electric power is supplied to the circuit board 6.

The novel repositioning and removal tool 2 includes a vacuum suction nozzle 8 with a suction opening 10. In the novel method, the suction opening 10 is positioned over the μLED 4X that is to be removed or repositioned. The repositioning and removal tool 2 also includes a laser beam emitter 11 used to direct a heating laser beam 12 through the center of the vacuum suction nozzle 8 and through the suction opening 10 onto the μLED 4X to be removed or repositioned. The heat from the laser beam 12 releases the μLED 4X from the circuit board 6. The released μLED 4X is sucked into the vacuum suction nozzle 8 and is thereby removed from the circuit board 6. Where tool 2 is used for repositioning, the adaptor tip of the vacuum suction nozzle 8 is designed such that the μLED 4X is held by, as opposed to being sucked into, the vacuum suction nozzle 8. For this purpose, the adapter tip can be manually or automatically placed on the vacuum suction nozzle 8, or another nozzle may be used.

Figure 7:
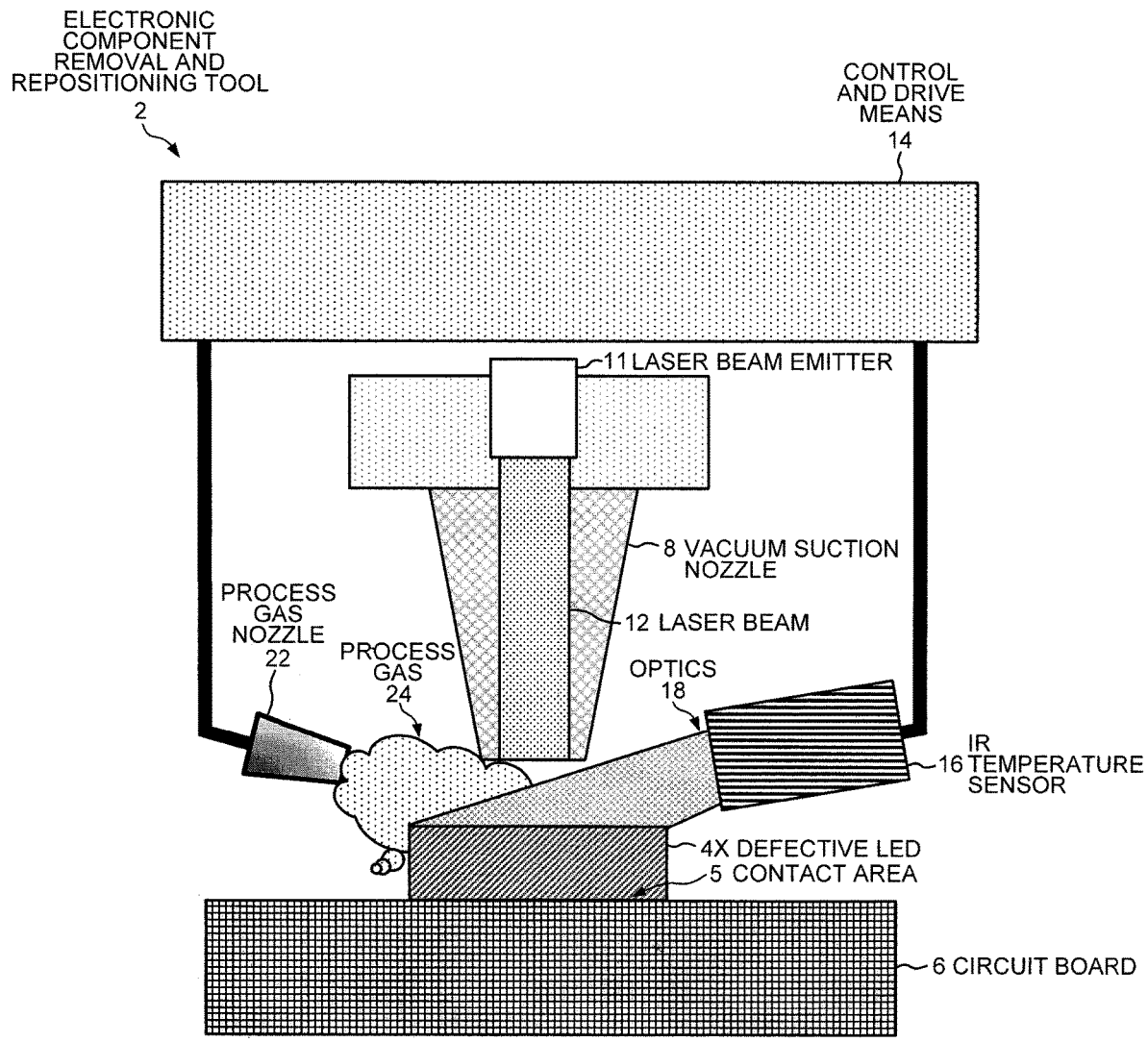
FIG. 7 is a schematic diagram illustrating the interconnection of the various components of the first and third embodiments.

As shown in FIG. 7, a control and drive means 14 controls the positioning of the repositioning and removal tool 2 with its vacuum suction and controls the laser beam emitter 11. The control and drive means 14 can also rotate a μLED 4X that is held at the exchangeable adaptor tip of the vacuum suction nozzle 8. Because the laser beam 12 is small in diameter and because it can be focused, it is possible to heat up only the defective or erroneously placed μLED 4X and its contact area 5. By focusing heat only on the defective μLED 4X, damage to neighboring μLEDs 4 by burning is avoided. During the removal process, the tool 2 is positioned in the x-y plane only; no movement in the z direction is necessary. By eliminating the need to move the tool 2 in the z dimension, the speed of removing defective components is increased. However, for the case in which the μLED 4X that is held at the tip of the vacuum suction nozzle 8 is to be repositioned on the circuit board 6, the vacuum suction nozzle 8 approaches the circuit board 6 and properly repositions the μLED 4X on the intended contact area 5. Afterwards, the repositioned μLED 4X is remounted on the circuit board 6, for example by applying solder. Alternatively, the solder already present in the contact area 5 and liquefied during the heating of the μLED 4X may be used for remounting, and the μLED 4X is held at the contact area until the liquefied solder has solidified.

Figure 3:
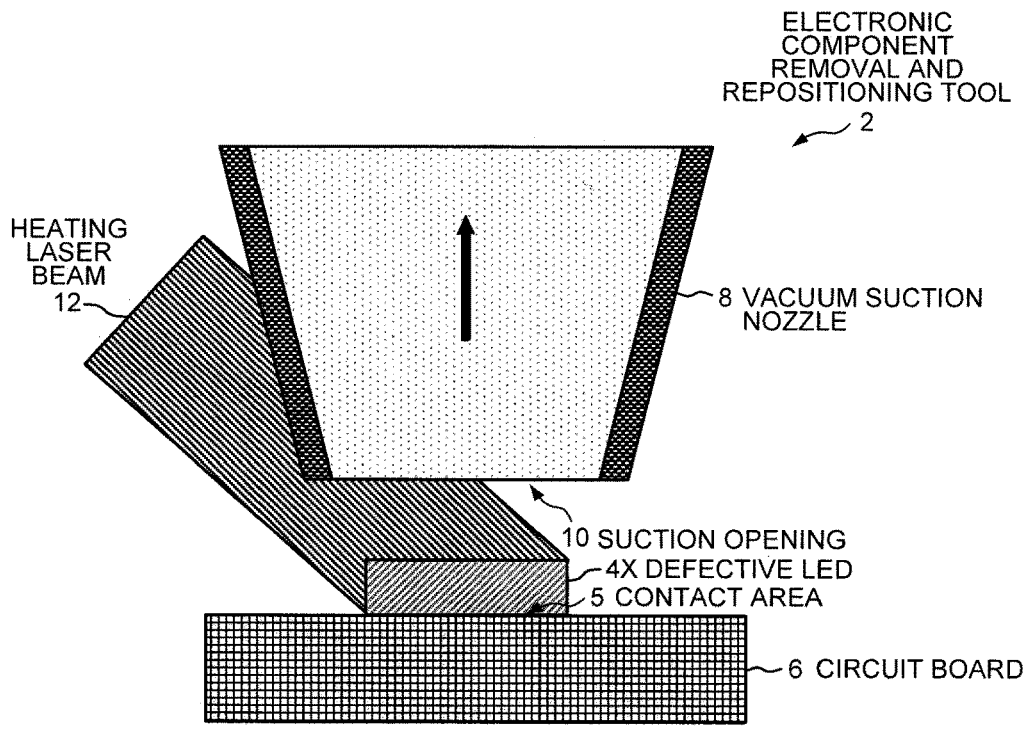
FIG. 3 is a cross-sectional view of a second embodiment with the laser beam being directed from the side to a spot under the suction nozzle opening.

FIG. 3 is a cross-sectional view of a second embodiment similar to the first embodiment of FIG. 2. In the second embodiment of FIG. 3, however, the laser beam 12 is guided from outside the vacuum suction nozzle 8 to an area below the suction opening 10. This is achieved by rigidly mounting the laser beam emitter 11 to the outside of the tool 2 such that the laser beam 12 is directed to the area below the suction opening 10. Positioning of the vacuum suction nozzle 8 thereby simultaneously positions the laser beam 12 on the defective or erroneously placed μLED 4X that is to be removed or repositioned. All other features of the second embodiment are the same as those of the first embodiment.

Figure 4:
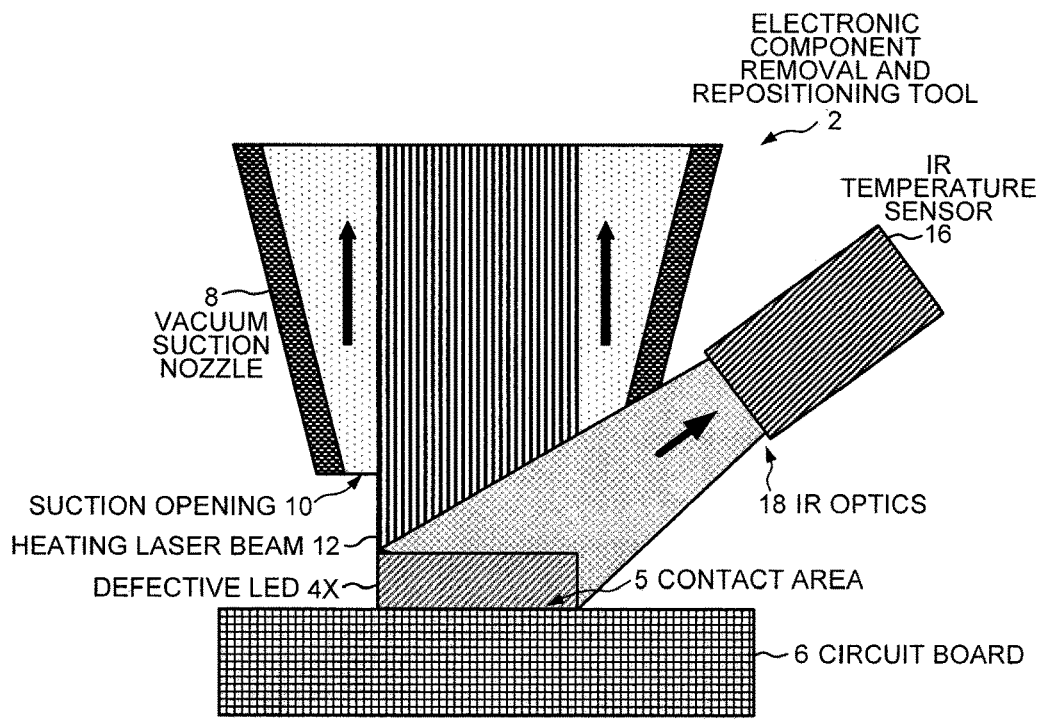
FIG. 4 is a schematic diagram showing a third embodiment with an infrared temperature sensor with optics directed to the heated location.

FIG. 4 is a diagram illustrating a third embodiment. In addition to the features of the first embodiment, an IR temperature sensor 16 is added to the third embodiment. The IR temperature sensor 16 includes IR optics 18 for contactless measurement of the temperature of the defective or erroneously placed μLED 4X and its vicinity. The IR optics 18 include a lens that focuses the infrared radiation emitted from the heated object onto a detector, such as a thermopile, which outputs a voltage that is proportional to the incident infrared energy and also the temperature of the heated object. By measuring the temperature of the defective or erroneously placed μLED 4X during the heating step of the novel method and correspondingly controlling the heat energy emitted by the laser beam emitter 11, the temperature during the removal process can be controlled by the control and drive means 14. For example, the laser beam 12 is turned off when the measured temperature around the contact area 5 exceeds a threshold temperature at which the solder that attached the μLED 4X to the circuit board 6 has melted.

Figure 5:
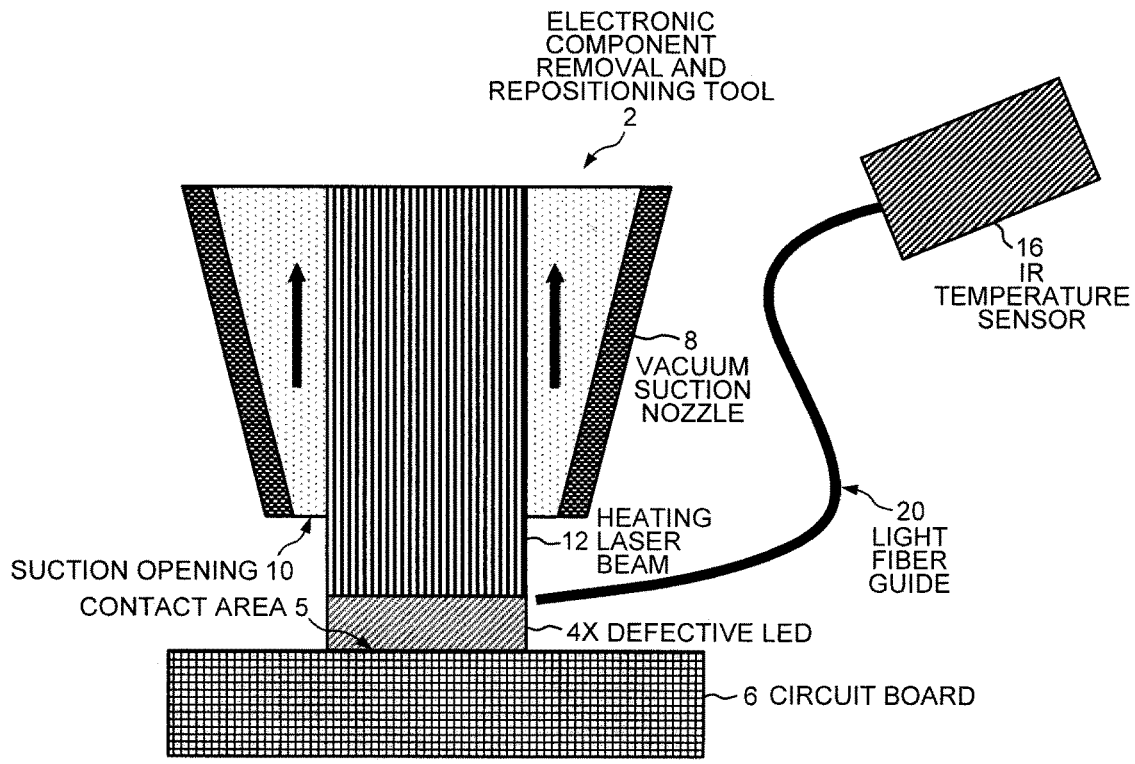
FIG. 5 is a schematic diagram showing a fourth embodiment with an infrared temperature sensor provided with a light guide fiber with its free end positioned in the vicinity of the heated location.

In the fourth embodiment of FIG. 5, a monofilament light fiber guide 20 is connected to the IR temperature sensor 16 instead of using the IR optics 18 of the third embodiment. The free end of the light fiber guide 20 is positioned close to the heated defective μLED 4X and guides the IR emissions from the μLED 4X to the sensor 16 to be used to determine the temperature of the μLED 4X.

It has been found that temperature measured by the IR temperature sensor 16 significantly changes when the defective μLED 4X with its associated liquid solder is released from the circuit board 6. This sharp change of temperature, which appears because the heat energy can no longer dissipate from the μLED 4X to the circuit board, is used as an indication to stop the heating process, i.e., to stop emitting the laser beam 12 within milliseconds of the sharp rise in temperature. The subsequent burning of the circuit board 6 and non-defective μLEDs 4 is thereby avoided.

The temperature is preferably measured by an IR sensor 16 with appropriate optics 18 without contacting the heated contact area 5 or the defective μLED 4X that is to be removed or repositioned. The IR sensor 16 is positioned outside of the repositioning and removal tool 2, and the IR radiation is either guided outside of the tool 2 to the IR sensor as shown in FIGS. 4 and 5 or is guided from the inside of the vacuum suction nozzle 8 and out with the laser beam 12 using a beam splitting unit 25 as shown in FIG. 6.

Figure 6:
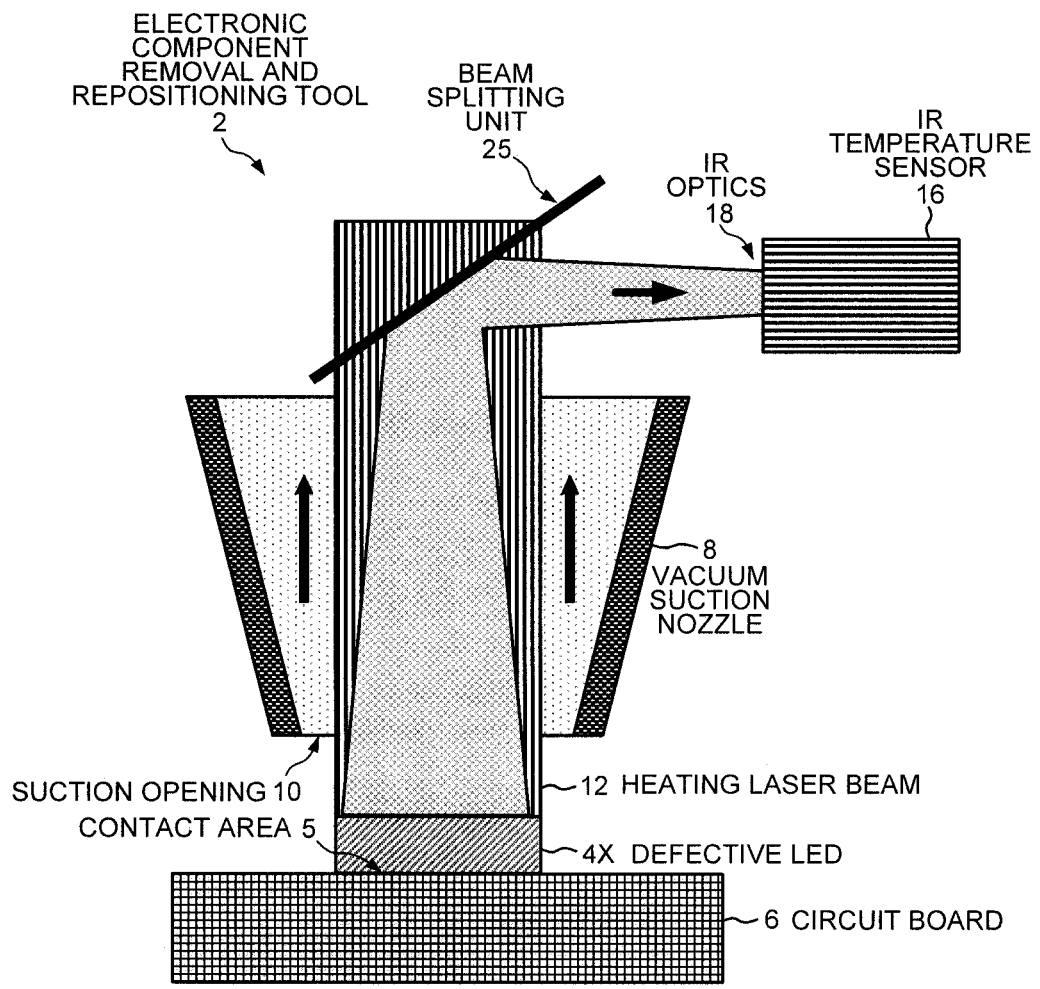
FIG. 6 is a schematic diagram showing the fifth embodiment with an infrared temperature sensor coupled in the laser path by a beam splitting unit.

FIG. 6 is a diagram illustrating a fourth embodiment with an IR temperature sensor 16 coupled in the path of the laser beam 12 by the beam splitting unit 25. The configuration of the fourth embodiment renders the paths of the IR radiation and the laser beam 12 partly collinear instead of using optics 18 to receive the IR radiation from the defective μLED 4X below the suction opening 10 outside the vacuum suction nozzle 8. The beam splitter unit 25 filters the IR radiation from the laser beam and reflects the IR radiation to the IR temperature sensor 16 with an appropriate optics 18.

FIG. 7 shows a diagram illustrating the interconnection of the various components in the first and third embodiments. In addition, FIG. 7 shows a process gas nozzle 22 used to direct process gas 24 towards the heated defective μLED 4X that is to be removed. The process gas helps to avoid oxidation of the liquefied solder during the heating step and it may support the heating dynamics during the heating step. Application of process gas is likewise controlled by the control and drive means 14. The process gas 24 may be nitrogen, argon, helium or formid-gas.

Figure 8:
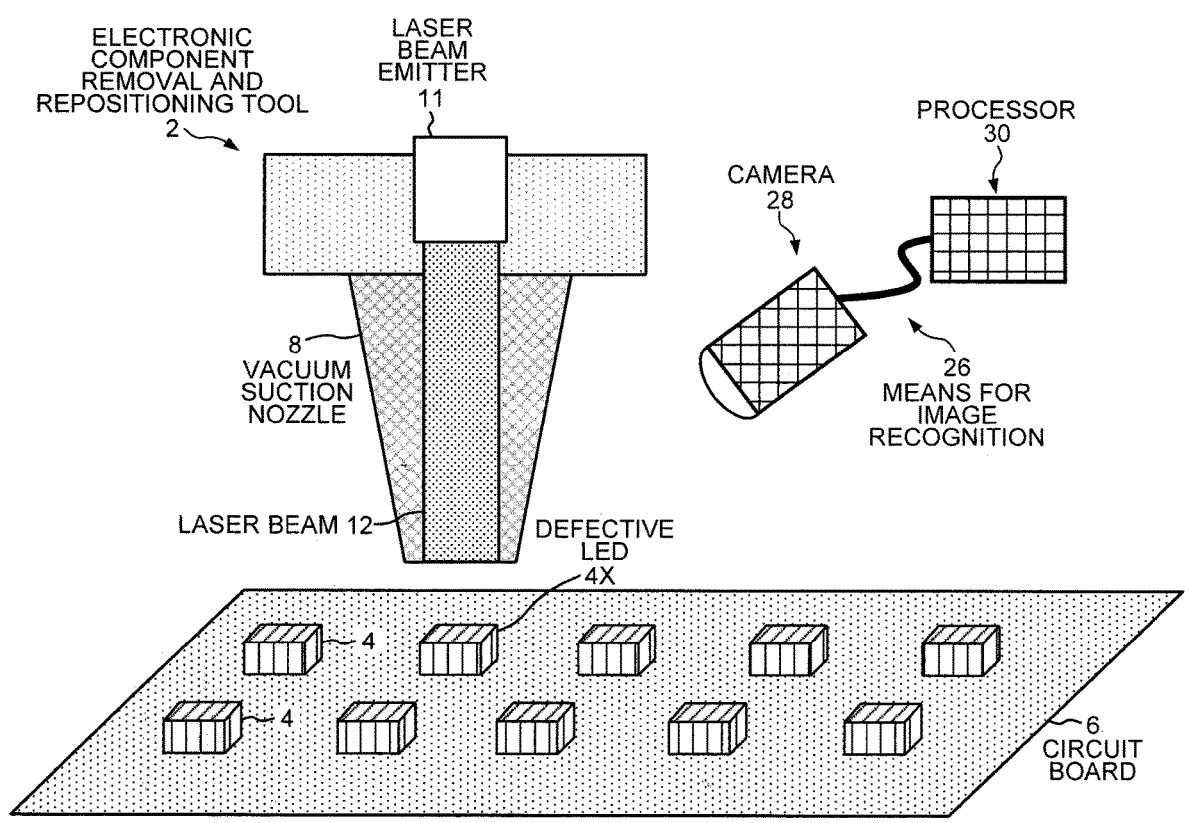
FIG. 8 is a schematic diagram showing a sixth embodiment including an image recognition means including a camera and a processing unit.

FIG. 8 shows a sixth embodiment of the present invention including image recognition means 26 constituted by a camera 28 and a processing unit 30 which are communicatively connected. It needs to be noted that the processing unit 30 controls the camera 28 and that it may also be included in the control an drive means 14. In particular, the image recognition unit 26 may distinguish between defect and erroneously arranged iLEDs 4x. For this purpose, electric power may be supplied to the circuit board 6 and defected or erroneously arranged μLEDs 4x may be identified as μLEDs which are not illuminated. Afterwards, the image recognition means 26 performs an image recognition processing in which a μLED 4x is identified as erroneously arranged if the μLED 4x is shifted or rotated with respect to an intended contact area 5 or if the contacts of the μLED 4x are not placed on intended contact pads. In case the μLED 4x is arranged properly, the μLED 4x is identified by the image recognition processing as defect.

FIGS. 9A, 9B, 9C and 9D illustrate various stages of the seventh embodiment for repositioning an erroneously arranged μLED 4X on the circuit board 6. In FIG. 9A, the μLED 4X is not properly arranged on the dedicated contact pads 31 on the circuit board 6 such that the μLED 4X does not properly illuminate when electric power is applied to the circuit board 6. In FIG. 9B, the repositioning tool 2 is positioned above the μLED 4X, and the laser beam 12 is applied to the μLED 4X in order to liquefy the solder 32 below the μLED 4X. In the meantime, the μLED 4X is sucked upwards by the vacuum suction nozzle 8 (see the arrows in FIG. 9B). As shown in FIG. 9B, the suction opening 10 of the vacuum suction nozzle 8 is adapted to hold the μLED 4X at the top of the vacuum suction nozzle 8. In particular, the diameter of the suction opening 10 is designed smaller than the diameter of the μLED4X, i.e., than a diameter of a housing of the μLED 4X. Therefore, the μLED4X and the solder 32 are not sucked into the vacuum suction nozzle 8.

Then the μLED 4X is positioned such that the contacts of the μLED 4X are positioned directly above the dedicated contact pads 32. For this reason, the μLED 4X can be rearranged in a plane parallel to the circuit board 6 and can be rotated with respect to the circuit board 6. The solder 32 remains below the μLED 4X and is reused to affix the μLED 4X to the circuit board 6 after repositioning. FIG. 9C shows the μLED 4X after being shifted slightly to the left. During the operation shown in FIG. 9C, the μLED 4X remains sucked to the adaptor tip of the vacuum suction nozzle 8. After the μLED 4X is properly positioned, the vacuum suction nozzle 8 and the sucked in μLED 4X are moved towards the circuit board 6, as indicated by the arrow in FIG. 9D. After the solder 32 again solidifies, the μLED 4X is properly positioned on the circuit board 6 and affixed thereto by the solidified solder 32.

Although not shown in any of FIGS. 9A-9D, the μLED 4X can also be positioned on the circuit board 6 without moving the vacuum suction nozzle 8 towards the circuit board 6. This can be achieved by stopping the suction such that the μLED 4X falls towards the circuit board 6. Alternatively, the flow direction in the vacuum suction nozzle 8 can be reversed such that the μLED 4X is blown or jetted towards the circuit board 6.

In another embodiment, the contact pads 31 are positioned at the sides of the μLED 4X. The contact pads 31 are heated, and the liquefied solder 32 is sucked into the vacuum suction nozzle 8 before the repositioning of the μLED 4X. According to this embodiment, the repositioning and removal tool 2 includes a means for applying solder in order to remount the repositioned μLED 4X onto the circuit board 6.

The μLEDs 4 and 4X are usually soldered to the circuit board 6. Similarly, adhesives may be used to mount the μLEDs 4 and 4X or other electronic components to the circuit board 6.

The various embodiments may be combined. The different temperature measurement arrangements may be combined with the different ways of guiding the laser beam 12 to the defective μLEDs 4X that are to be removed. Likewise, the application of process gas 24 may combined with the aforementioned combinations. Similarly, the image recognition may be combined with the various other embodiments.

LIST OF REFERENCE NUMBERS 2 removal and repositioning tool
4 μLED
4X defective μLED to be removed or repositioned
5 contact areas
6 circuit board
8 vacuum suction nozzle
10 suction opening
11 laser beam emitter
12 laser beam
14 control and drive means
16 IR temperature sensor
18 IR optics
20 monofilament light fiber guide
22 process gas nozzle
24 process gas
25 beam splitter
26 means for image recognition
28 camera
30 processor
31 contact pads
32 solder Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A device for removing and repositioning an electronic component from a contact area on a circuit board, comprising:
    a first exchangeable adaptor tip of a vacuum suction nozzle, wherein a vacuum suction is generated at the vacuum suction nozzle such that the electronic component that is to be removed or repositioned is drawn towards the vacuum suction nozzle by the vacuum suction, wherein the first exchangeable adaptor tip is configured with an opening through which the electronic component can pass into the vacuum suction nozzle;
    a second exchangeable adaptor tip of the vacuum suction nozzle, wherein the second exchangeable adaptor tip is configured such that the electronic component is prevented from entering into the vacuum suction nozzle and is held by the vacuum suction at the second exchangeable adaptor tip; and
    a laser beam emitter oriented so as to emit a laser beam through the vacuum suction nozzle towards the contact area on the circuit board.

2. The device of claim 1, wherein the electronic component is a light emitting diode of a matrix of light emitting diodes mounted onto the circuit board.

3. The device of claim 1, further comprising:
    a camera used to perform image recognition to identify whether the electronic component is to be removed through the first exchangeable adaptor tip or held and repositioned by the second exchangeable adaptor tip.

4. A device for removing and repositioning an electronic component from a contact area on a circuit board, comprising:
    a vacuum suction nozzle with an exchangeable adaptor tip, wherein a vacuum suction is generated at the exchangeable adaptor tip such that the electronic component that is to be removed or repositioned is drawn towards the exchangeable adaptor tip by the vacuum suction;
    a laser beam emitter oriented so as to emit a laser beam through the vacuum suction nozzle and out the exchangeable adaptor tip towards the contact area on the circuit board; and a temperature sensor adapted to measure a temperature around the contact area based on infrared radiation emitted from around the contact area.

5. The device of claim 4, wherein the exchangeable adaptor tip is configured to allow the electronic component that is to be removed to pass through the exchangeable adaptor tip and into the vacuum suction nozzle.

6. The device of claim 4, wherein the exchangeable adaptor tip is configured to prevent the electronic component that is to be repositioned to pass through the exchangeable adaptor tip and is configured to hold the electronic component on the vacuum suction nozzle.

7. The device of claim 4, further comprising:
a camera; and
a processor, wherein the camera and the processor perform image recognition to identify whether the electronic component is to be removed or repositioned.

8. The device of claim 4, further comprising:
a control and drive means that shuts off the laser beam emitter when the temperature sensor senses a sharp increase in temperature.

9. The device of claim 4, wherein the electronic component is a defective light emitting diode of a matrix of light emitting diodes mounted onto the circuit board.

10. A method for removing and repositioning an electronic component on a circuit board, comprising:
positioning an exchangeable adaptor tip of a vacuum suction nozzle over the electronic component, wherein the electronic component is mounted at a contact area on the circuit board;
directing a laser beam through the exchangeable adaptor tip and onto the electronic component;
heating the electronic component using the laser beam; and
sucking the electronic component towards the exchangeable adaptor tip of the vacuum suction nozzle using vacuum suction.

11. The method of claim 10, further comprising:
removing the electronic component by sucking the electronic component through the exchangeable adaptor tip and into the vacuum suction nozzle using the vacuum suction.

12. The method of claim 10, further comprising:
holding the electronic component on the exchangeable adaptor tip using the vacuum suction;
moving the vacuum suction nozzle so as to reposition the electronic component on the contact area; and
remounting the electronic component onto the circuit board.

13. The method of claim 10, further comprising:
performing image recognition to determine whether the electronic component is to be removed or repositioned.

14. The method of claim 13, further comprising:
moving the exchangeable adaptor tip into position on the vacuum suction nozzle based on whether the electronic component is to be removed or repositioned.

15. The method of claim 10, wherein the electronic component is a light emitting diode arranged in a matrix among other light emitting diodes on the circuit board, further comprising:
supplying electric power to the circuit board to determine whether the electronic component is to be removed or repositioned.

16. The method of claim 10, wherein the electronic component is mounted onto the circuit board using solder.

17. The method of claim 10, wherein the electronic component is a light emitting diode.

18. The method of claim 10, further comprising:
measuring a temperature around the contact area; and
turning off the laser beam when the temperature around the contact area exceeds a threshold temperature.

19. The method of claim 18, wherein the temperature is measured based on infrared radiation emitted from around the contact area.

20. The method of claim 10, further comprising:
measuring a temperature of the electronic component based on infrared radiation emitted from the electronic component.

* * * * *